United States Patent [19]

Ogumi et al.

[11] Patent Number: 5,110,619
[45] Date of Patent: May 5, 1992

[54] METHOD FOR PRODUCTION OF FILMS

[76] Inventors: Zempachi Ogumi, 89-3, Matsunoki-cho, Shimogamo, Sakyo-ku, Kyoto-shi, Kyoto 606; Zenichiro Takehara, 10-14, Nishishimbayashi-cho 6-chome, Oe, Nishikyo-ku, Kyoto-shi, Kyoto 610-11, both of Japan

[21] Appl. No.: 582,228
[22] PCT Filed: Mar. 5, 1990
[86] PCT No.: PCT/JP90/00281
  § 371 Date: Oct. 1, 1990
  § 102(e) Date: Oct. 1, 1990
[87] PCT Pub. No.: WO90/10728
  PCT Pub. Date: Sep. 20, 1990

[30] Foreign Application Priority Data

Mar. 6, 1989 [JP] Japan ................................. 1-53991

[51] Int. Cl.⁵ ............................................. B05D 3/06
[52] U.S. Cl. ........................................ 427/38; 427/39; 118/723
[58] Field of Search .................... 427/38, 39, 248.1; 118/723

[56] References Cited

U.S. PATENT DOCUMENTS 4,298,629 11/1981 Nozaki et al. ...................... 427/39
4,901,669 2/1990 Yamamoto et al. ................ 118/723

Primary Examiner—Shrive Beck
Assistant Examiner—Roy V. King
Attorney, Agent, or Firm—Jordan and Hamburg

[57] ABSTRACT

In the method of producing a film which comprises transporting ions in the thickness direction of a film in the course of formation thereof and reacting the ions so transported to one surface of the film with a gas in a reaction chamber, the rate of film formation is increased by applying an external electric field in the thickness direction of the film and eliminating electric charges accumulating on the film surface via a plasma established in front of the film. The method is applicable to ionically conductive films of a solid electrolyte fuel cell or the like.

1 Claim, 1 Drawing Sheet

METHOD FOR PRODUCTION OF FILMS

TECHNICAL FIELD

Ionically conductive film is used in electrochemical cells such as solid electrolyte fuel cells (hereinafter referred to as SOFC), sensors, displays and so on. Whether it is an insulating film for surface treatment or for use in the fabrication of a semiconductor substrate or an electronically conductive film for use as an electrode material, super-conductive material or the like, there are cases in which the film acquires ionic conductivity during formation.

The present invention relates to a method for producing a film which is ionically conductive at least in the course of film formation.

BACKGROUND ART

As conventional film production technology, there is known an electrochemical vapor deposition method which Isenberg et al. developed for the manufacture of stabilized zirconia film for SOFC (cf. Japanese Patent Kokai Publication 61-153280). In the production of an yttria-stabilized zirconia film on a porous support by this electrochemical vapor deposition method, one side of the porous substrate is exposed to water vapor ($H_2O$) including oxygen ($O_2$) or hydrogen ($H_2$) and the other side to a gaseous mixture of zirconium tetrachloride ($ZrCl_4$) and yttrium trichloride ($YCl_3$).

In this film production method, the oxygen source gas molecules diffuse through pores of the support and react with the metal halide gas on the other side of the support to produce a thin film of yttria-stabilized zirconia on the surface of the support (CVD process). As this film grows, the pores of the support are blocked and the oxygen source gas molecules then cannot pass through the support any longer. However, because the yttria-stabilized zirconia film thus formed is ionically conductive, the oxygen source gas molecules are able to drift through the film in the form of oxygen ions ($O^{2-}$). Here, the $O^{2-}$ concentration gradient caused in the film by the difference in oxygen partial pressure between two sides of the film provides a driving force for ion transport. Therefore, the $O^{2-}$ ions diffuse through the film to meet with the metal halide gas to sustain the growth of the film (EVD process).

The electrochemical vapor deposition method, consisting of the above-mentioned two stages, viz. CVD and EVD, has the disadvantage that since the ion transport in the latter EVD process is dependent on the intramembrane concentration gradient of $O^{2-}$ ion, the film formation in the EVD process is slow. This is because negative charges left over by $O^{2-}$ ions accumulate on the growth side of the film and the potential barrier produced by these surface charges seriously interferes with the transport of other $O^{2-}$ ions. In order to improve the driving force of reaction, it might be contemplated to increase the difference in oxygen partial pressure between the two sides of the growing film but if the oxygen partial pressure on the metal halide gas side is reduced too much, the resulting film will have a surface composition deviating from the expected composition.

The present invention has been accomplished with the above-mentioned circumstances in view. Thus, the object of the invention is to provide a method of producing a film which provides a desired surface composition while improving the rate of film formation in the EVD stage of the conventional electrochemical vapor deposition method.

DISCLOSURE OF INVENTION

The film forming method according to the present invention is characterized in that the growth of a film is promoted by removing the electric charges accumulating on the growth side of the film in the course of film formation. More particularly, the invention is characterized by applying an external electric field in the thickness direction of the film in the course of film formation to accelerate the ion transport and establishing a plasma in front of the film growing surface.

Removal of charges on the growth side of the film precludes formation of a potential barrier on this surface. Therefore, the ion transport in the film in the course of formation is not inhibited but the chemical reaction between the transported ion and the gas within the reaction chamber is promoted to increase the rate of film formation. Thus, in accordance with the present invention, it is possible to obtain a desired film with a dense surface texture while improving the rate of film formation in the EVD stage of the electrochemical vapor deposition method.

When an external electric field is applied in the thickness direction of the film in the course of film formation to accelerate the ions within the film and a plasma is established in front of the film growth side, not only an electric field in the film serves as a driving source for ion transport but the electric charges are effectively eliminated through the electrically conductive plasma so that the rate of film formation can be remarkably increased. Control of the film forming rate is also facilitated.

BEST MODE FOR CARRYING OUT THE INVENTION

Figure 1:
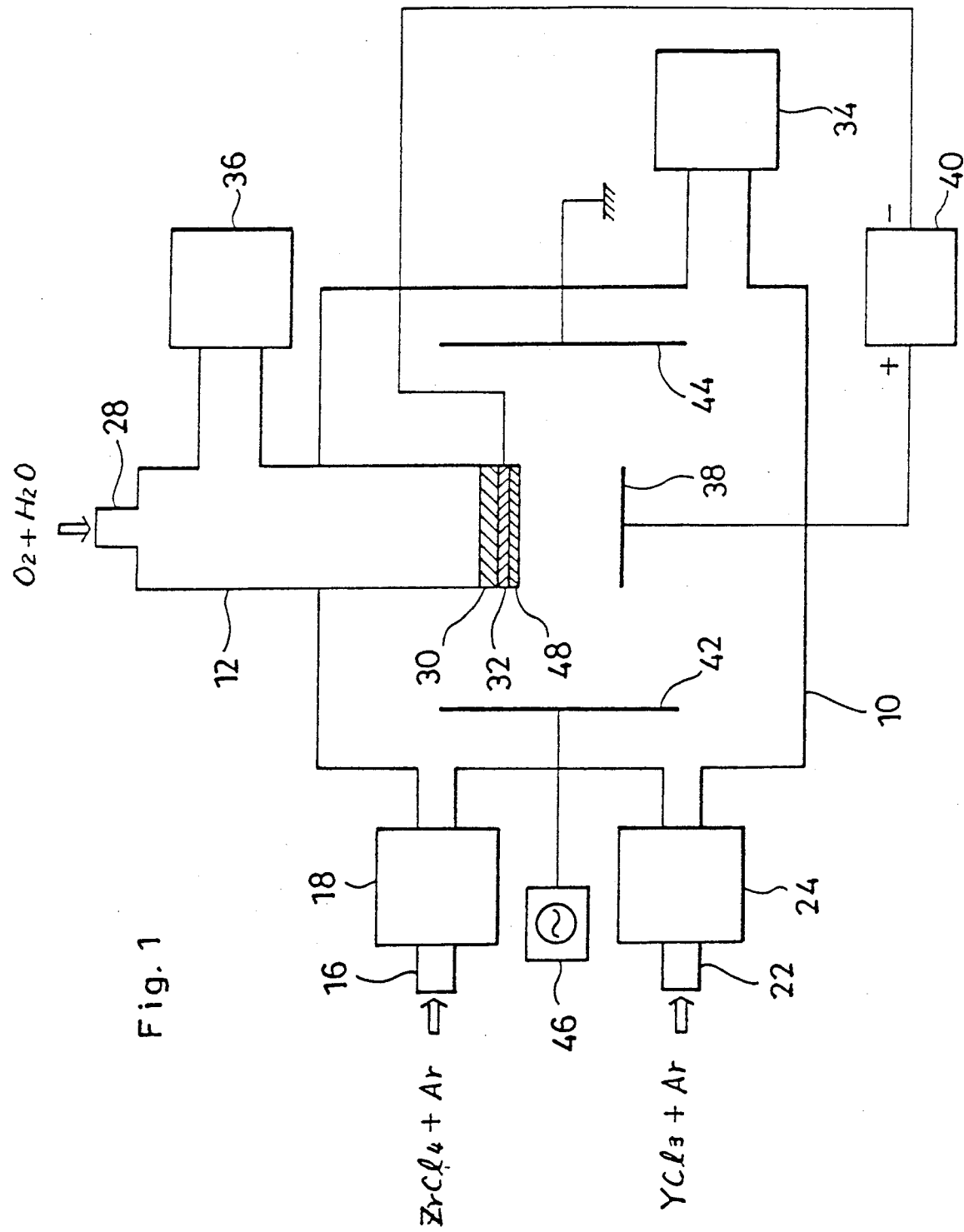
FIG. 1 is a schematic view showing a film manufacturing apparatus which can be used in the working of a film manufacturing method embodying the principle of the invention.

FIG. 1 shows an exemplary film manufacturing apparatus to be used in the practice of an example of the invention. Illustrated is an apparatus utilizing a low-temperature plasma for the production of yttria-stabilized zirconia film, which is an ionically conductive film, on a porous support. It should be understood that the film manufacturing method of the invention can be applied not only to the production of yttria-stabilized zirconia film but also to the production of various other films.

Disposed in a reaction chamber 10 is a tip portion of an oxygen source gas container 12 in mutually gas-tight relation. The reaction chamber 10 is supplied with $ZrCl_4$ gas carried by argon gas (Ar) through a gas inlet 16 and an electric furnace 18, and $YCl_3$ gas carried by Ar gas through a gas inlet 22 and an electric furnace 24. The $ZrCl_4$ gas diluted with Ar gas is heated to 450° C. in the first electric furnace 18 and the $YCl_3$ gas diluted with Ar gas is heated to 800° C. in the second electric furnace 24 before they are introduced into the reaction chamber 10. The oxygen source gas container 12 is supplied with a gaseous mixture of $O_2$ and $H_2O$ through a gas inlet 28. The tip of the oxygen source gas container 12 is provided with a porous support 30, which may for example be made of alumina, and a porous electrode 32, which may for example be made of platinum, on the side of said support which is exposed to the interior of the reaction chamber. As will be described hereinafter, in this apparatus, an yttria-stabilized zirconia film 48 is formed on the porous electrode 32 within the reaction chamber 10. The interior of the reaction chamber 10 is maintained at a pressure of, for example, 0.7 Torr by means of a first evacuation pump 34. On the other hand, the interior of the oxygen source gas container 12 is maintained at a pressure of, for example, 1.5 Torr by means of a second evacuation pump 36.

Within the reaction chamber 10, a counter electrode 38 is disposed in front of and parallel to the porous electrode 32 and a voltage of 60 V is applied from a direct current source 40 between these electrodes 32 and 38. However, the direct current source 40 is connected in a direction such that the potential is lower on the porous electrode 32 side. Also installed in the reaction chamber 10 and perpendicular to the axis of orientation of these parallel electrodes 32, 38 are plasma generating electrodes 42 and 44 which are disposed in juxtaposed relation. Between these plasma generating electrodes 42 and 44 is applied a high frequency electric power of 13.56 MHz and 50 W from a high frequency power source 46. The whole reaction chamber 10 is heated with a heater not shown so that the porous support 30 and porous electrode 32 are maintained at a reaction temperature of 1,050° C.

The CVD process proceeds in the usual manner. Thus, the gas molecules ($O_2$ and $H_2O$) within the oxygen source gas container 12 pass through the pores of said porous support 30 and porous electrode 32 into the reaction chamber 10. The oxygen source gas molecules reaching the reaction chamber 10 react with the metal halide gases, viz. $ZrCl_4$ gas and $YCl_3$ gas, to produce a film 48 composed of yttria-stabilized zirconia on the surface of the porous electrode 32 which is disposed on the reaction chamber side. As this film grows, the pores of the porous electrode 32 are blocked by the film 48, whereby the CVD process is completed.

However, in the film manufacturing method embodying the principle of the present invention, the direct current voltage applied between the porous electrode 32 and the counter electrode 38 generates an electric field in the direction of accelerating the $O^{2-}$ ions within the ionically conductive yttria-stabilized zirconia film 48. Moreover, within the reaction chamber 10 and in front of the growing film 48, a low-temperature plasma is established between the electrodes 42, 44 by the electric power supplied from the high frequency power source 46. This plasma establishes electrical conductivity in the gap between the film 48 and the electrode 38. Therefore, the oxygen source gas molecules in the oxygen source gas container 12 which are converted to $O^{2-}$ ions by reduction at the porous electrode 32 are not only driven by the oxygen partial pressure differential between two sides of the film 48 but also accelerated by the electric field, so that the $O^{2-}$ ions drift through the growing film 48 to reach its surface. The $O^{2-}$ ions reaching the surface of film 48 react with the $ZrCl_4$ and $YCl_3$ gases to give yttria-stabilized zirconia. Moreover, as the result of the above, the negative charge remaining on the surface of the film 48 flows into the electrode 38 through the plasma established between the film 48 and counter electrode 38. Therefore, following the CVD process, the EVD proceeds with high efficiency.

By the above-described method which comprises applying a voltage to the electrodes 32 and 38 by means of a direct current source 40 and generating a plasma by means of a high frequency power source 46, a 5 μm-thick yttria-stabilized zirconia film could be obtained in 30 minutes.

In the film manufacturing method described above, since the electric field established within the growing film 48 acts as a driving force for ion transport in the film, the rate of film formation can be controlled merely by adjusting the output voltage of the direct current source 40. Furthermore, the film manufacturing method of the present invention can be applied to any film exhibiting ionic conductivity in the course of film formation and even to cases in which the completely grown film is treated to eliminate its ionic conductivity. It should be understood that the reaction chamber 10 may be supplied with a mixture of $ZrCl_4$ and $YCl_3$ gases using Ar gas as the carrier gas. When the high frequency power source 46 is connected in series to the direct current source 40, the electrodes 32 and 38 may double as the plasma generating electrodes. Furthermore, instead of establishing a plasma, the electric charges on the film surface can be eliminated by irradiation with charged particles such as an ion beam or electron beam.

In the conventional method neither applying a voltage to electrodes 32, 38 from a direct current source 40 nor establishing plasma with a high frequency power source 46, it took four hours to obtain an yttria-stabilized zirconia film having a thickness of about 5 μm. Thus, compared with the conventional method, the above-described film manufacturing method of the present invention accomplished an eight-fold increase in the rate of film formation, when other conditions were the same as those used in the above embodiment of the invention. When a direct current of 60 V was applied between electrodes 32, 38 without establishment of a plasma, no flow of electric current was observed between these electrodes, nor was found an improvement in the rate of film formation.

We claim:

1. A method of producing a film comprising steps of transporting ions in a thickness direction of the film in the course of formation thereof and reacting the ions thus transported to one surface of said film with a gas within a reaction chamber to give a desired film, wherein said formation of the film is done on a substrate which is a porous electrode, an electric field is applied in said reaction chamber between said porous electrode and a counter electrode and in the thickness direction of the film in the course of formation thereof so as to accelerate transport of ions, and a plasma generated by another pair of electrodes is established in front of said surface to thereby eliminate via said plasma the electric charges accumulating on said surface.

* * * * *